US008803228B2

(12) United States Patent
Lindsay et al.

(10) Patent No.: US 8,803,228 B2
(45) Date of Patent: *Aug. 12, 2014

(54) MEMORY ARRAYS WITH ROWS OF MEMORY CELLS COUPLED TO OPPOSITE SIDES OF A CONTROL GATE

(75) Inventors: Roger W. Lindsay, Boise, ID (US); Lyle Jones, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 212 days.

This patent is subject to a terminal disclaimer.

(21) Appl. No.: 13/359,947

(22) Filed: Jan. 27, 2012

(65) Prior Publication Data
US 2012/0127793 A1    May 24, 2012

Related U.S. Application Data

(60) Continuation of application No. 12/579,927, filed on Oct. 15, 2009, now Pat. No. 8,114,737, which is a division of application No. 11/210,523, filed on Aug. 24, 2005, now Pat. No. 7,619,279, which is a division of application No. 10/205,977, filed on Jul. 26, 2002, now Pat. No. 7,019,353.

(51) Int. Cl.
*H01L 29/66* (2006.01)

(52) U.S. Cl.
USPC ............................ 257/329; 257/315; 365/72

(58) Field of Classification Search
USPC ........... 257/314, 316; 361/51, 63, 72; 365/51, 365/63, 72
See application file for complete search history.

(56) References Cited

U.S. PATENT DOCUMENTS

| | | | |
|---|---|---|---|
| 4,675,848 A | 6/1987 | Karp et al. | |
| 5,278,438 A | 1/1994 | Kim et al. | |
| 5,305,252 A | 4/1994 | Saeki | |
| 5,379,255 A | 1/1995 | Shah | |
| 5,566,104 A | 10/1996 | Shinkawata | |
| 6,157,058 A | 12/2000 | Ogura | |
| 6,157,061 A | 12/2000 | Kawata | |
| 6,339,239 B1 | 1/2002 | Alsmeier et al. | |
| 6,438,028 B1 | 8/2002 | Kobayashi et al. | |
| 6,882,572 B2 | 4/2005 | Wang et al. | |
| 8,114,737 B2 * | 2/2012 | Lindsay et al. | 438/257 |
| 2002/0028541 A1 | 3/2002 | Lee et al. | |

* cited by examiner

*Primary Examiner* — Laura Menz
*Assistant Examiner* — Candice Y Chan
(74) *Attorney, Agent, or Firm* — Dicke, Billig & Czaja, PLLC

(57) ABSTRACT

A memory array includes a control gate, where every memory cell coupled to a first side of the control gate is within a first row of memory cells and every memory cell coupled to a second side of the control gate is within a second row of memory cells, and where the first row of memory cells is successively adjacent to the second row of memory cells. The memory array also includes alternating first and second bit lines, where each of the memory cells of the first row of memory cells is coupled to a respective one of the first bit lines, where each of the memory cells of the second row of memory cells is coupled to a respective one of the second bit lines, and wherein the first bit lines are different from the second bit lines.

21 Claims, 5 Drawing Sheets

MEMORY ARRAYS WITH ROWS OF MEMORY CELLS COUPLED TO OPPOSITE SIDES OF A CONTROL GATE

RELATED APPLICATIONS

This application is a continuation of U.S. patent application Ser. No. 12/579,927, titled "METHODS OF FORMING MEMORY CELLS ON PILLARS AND MEMORIES WITH MEMORY CELLS ON PILLARS," filed Oct. 15, 2009 and issued as U.S. Pat. No. 8,114,737 on Feb. 14, 2012, which application is a divisional of U.S. patent application Ser. No. 11/210,523, titled, "THREE DIMENSIONAL FLASH CELL," filed Aug. 24, 2005 and issued as U.S. Pat. No. 7,619,279 on Nov. 17, 2009, which application is a divisional of U.S. patent application Ser. No. 10/205,977 of the same title, filed Jul. 26, 2002 and issued as U.S. Pat. No. 7,019,353 on Mar. 28, 2006, all of which applications are commonly assigned and incorporated by reference in their entirety herein.

FIELD

The present invention relates generally to memory devices and in particular the present invention relates to memory arrays.

BACKGROUND

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

The non-volatile memory cells are fabricated as floating gate memory cells and include a source region and a drain region that is laterally spaced apart from the source region to form an intermediate channel region. The source and drain regions are formed in a common horizontal plane of a silicon substrate. A floating gate, typically made of doped polysilicon, is disposed over the channel region and is electrically isolated from the other cell elements by oxide. For example, gate oxide can be formed between the floating gate and the channel region. A control gate is located over the floating gate and can also made of doped polysilicon. The control gate is electrically separated from the floating gate by another dielectric layer. Thus, the floating gate is "floating" in dielectric so that it is insulated from both the channel and the control gate.

As semiconductor devices get smaller in size, designers are faced with problems associated with the production of memory cells that consume a small enough amount of surface area to meet design criteria, yet maintain sufficient performance in spite of this smaller size.

For the reasons stated above, and for other reasons stated below which will become apparent to those skilled in the art upon reading and understanding the present specification, there is a need in the art for an improved non-volatile memory cell.

DETAILED DESCRIPTION

Figure 1:
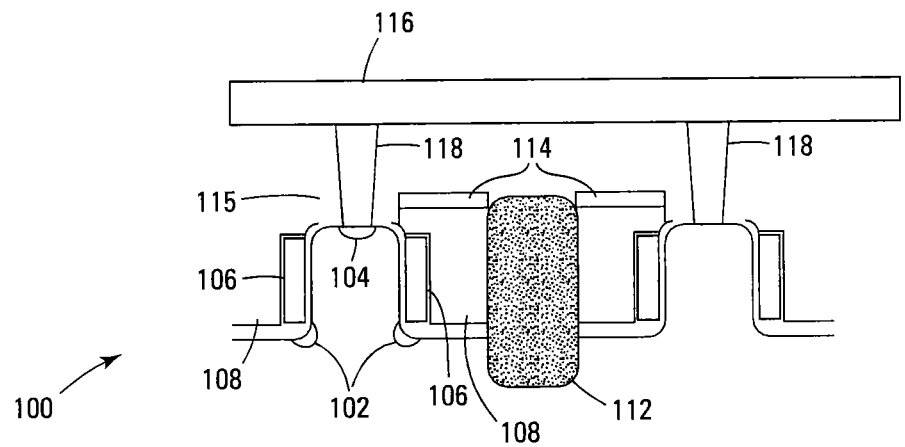
FIG. 1 is a cross section view of a transistor according to one embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

To aid in interpretation of the description of the illustrations and claims that follow, the term "semiconductor substrate" is defined to mean any construction comprising semiconductive material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductor substrates described above. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

In addition, as the structures formed by embodiments in accordance with the present invention are described herein, common semiconductor terminology such as N-type, P-type, N+ and P+ will be employed to describe the type of conductivity doping used for the various structures or regions being described. The specific levels of doping are not believed to be germane to embodiments of the present invention; thus, it will be understood that while specific dopant species and concentrations are not mentioned, an appropriate dopant species with an appropriate concentration to its purpose, is employed.

The term conductor is understood to also include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

Non-volatile memory cells, as explained above, can be formed as floating gate transistors. While the area of the transistors can be reduced, the coupling ratio between the floating gate and the control gate is also reduced. Generally, as the gate-coupling ratio between the floating gate and the control gate decreases, the work voltage necessary to operate the memory transistor increases. As a consequence, the operational speed and efficiency of the flash memory decrease tremendously.

Some methods for increasing the gate-coupling ratio include: increasing the overlapped area between the floating and the control gate, reducing the thickness of the dielectric layer between the floating gate and the control gate, and increasing the dielectric constant (k) of the dielectric layer between the floating gate and the control gate. Generally, to achieve an increase in the overlapped area between the floating and control gates and thus increase the gate-coupling ratio, the size of the floating gate has to be increased. However, this is not desirable for the demands of today's highly-integrated technologies.

Embodiments of the present invention provide a floating gate transistor that can occupy less memory die area while maintaining a large gate-coupling ratio. As explained below, the floating and control gates are formed substantially in a vertical direction.

Referring to FIG. 1, a cross section of a floating gate memory cell structure 100 is shown in detail. Memory cell structure 100 comprises source regions 102, drain 104, floating gates 106, and control gates 108. The drain region 104 is formed in a pillar of silicon 110 near its top. The source regions 102 are diffused near the bottom of the pillar. The region between each source region 102 and the drain region 104 defines a channel. In this manner, two source regions are associated with the same drain region in each of the pillars. Isolation regions 112 isolate cells 100 as shown in greater detail in FIG. 2. Different word lines 114, described in greater detail herein, access different source regions through the same drain region, so there are two memory cells on each pillar.

Bit lines 116 can then be formed to connect the drain contacts in a direction perpendicular to the word lines 114. This is accomplished in one embodiment by depositing a layer of dielectric 115 over drains 104. This dielectric layer may comprise boro-phospho-silicate glass (BPSG) or phospho-silicate glass (PSG). Alternatively, other low dielectric constant materials may be used. Contact openings are etched through the dielectric layer 115 to the drains 104, and contacts 118 are formed in the openings. Once the contacts are formed, a metal layer bit line 116 is formed to join the drain contacts.

Figure 2:
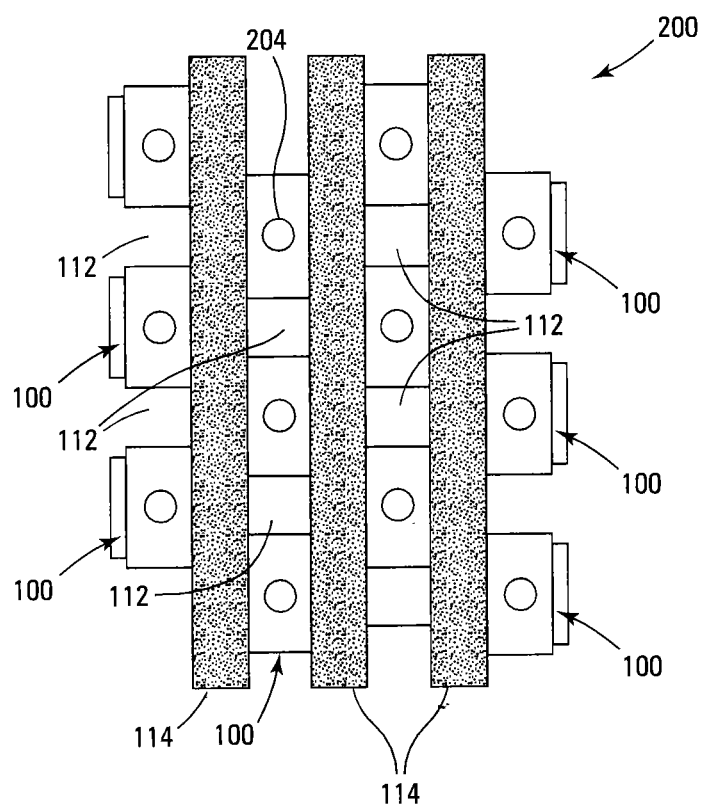
FIG. 2 is a plan view of an array of memory cells according to another embodiment of the present invention.

One embodiment 200 of an array of memory cells such as cells 100 is shown in plan view in FIG. 2. Word lines 114 run in the X direction, and contact multiple control gates of the various cells 100. Isolation regions 112 isolate transistors 100 in the X direction. For this description, rows of the array are shown extending in the X direction of FIG. 2, and columns of the array are shown extending in the Y direction of the FIG. 2. Each row of transistors in the array 200 has its cells 100 staggered from the cells 100 in adjacent rows, forming a staggered pattern of transistors.

Figure 2A:
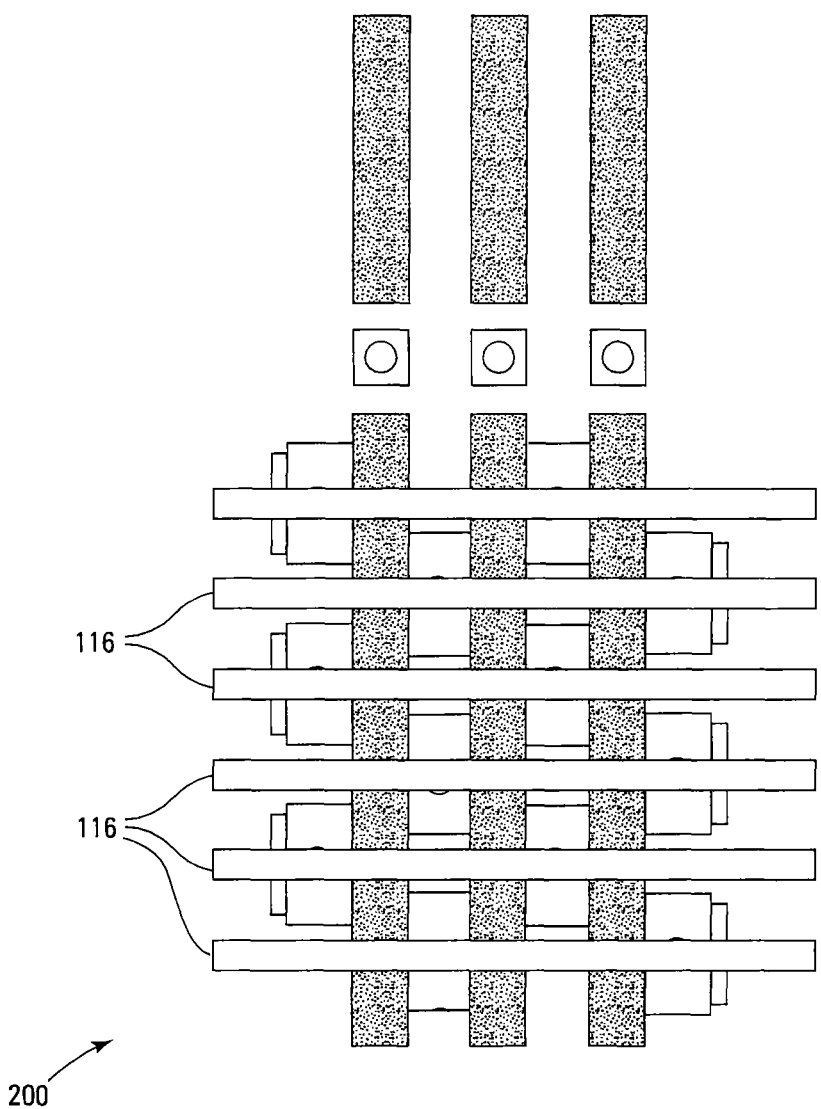
FIG. 2A is a plan view of an array of memory cells according to yet another embodiment of the present invention.

FIG. 2A shows a plan view of an array 200 with bit lines 116 (shown in greater detail in FIG. 1), which are formed to connect the drain contacts of pillars in every other row in a direction perpendicular to the word lines. Each column of memory cells comprises two transistors per pillar, every other row, as is best shown in FIG. 2 and FIG. 2A.

As can be seen in the figures, and especially FIG. 2, each control gate structure extends along a length in the X direction of the trench spanning multiple transistor pillars, so that one control gate structure is associated with multiple floating gates on alternating adjacent columns of transistors, and therefore is associated with multiple transistors and memory cells. Each word line 114 in FIG. 2 contacts alternating cells 100 in adjacent columns of the array 200. Two different word lines therefore provide word line contact for the two cells on each pillar. The cells share a common bit line. Addressing with the same bit line but a different word line allows access to each of the two cells on each pillar.

The features of one embodiment of the present invention can be described in greater detail with reference to a method of fabricating the transistors. The method is described in sufficient detail to provide an understanding of one method to form transistors of the present invention. It will be understood by those skilled in the art that all process steps are not described in detail herein, and that extra steps or modifications of the steps may be needed depending upon the integrated circuit design and manufacturing equipment.

Figure 4:
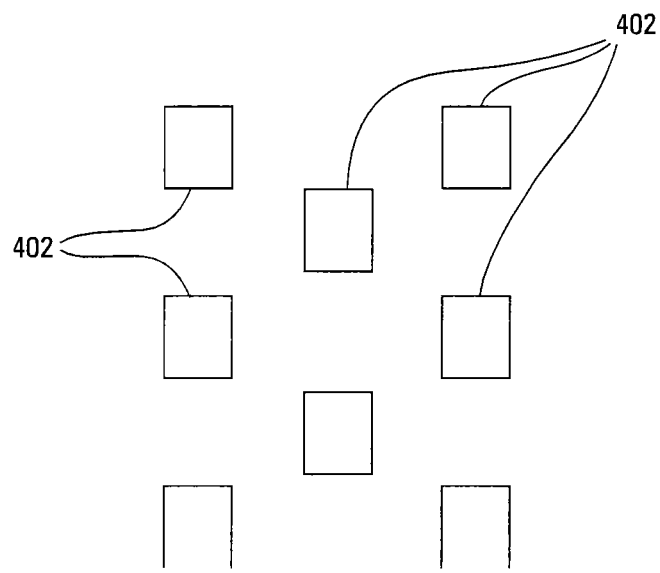
FIG. 4 is a plan view of the embodiment of FIG. 3.
Figure 3:
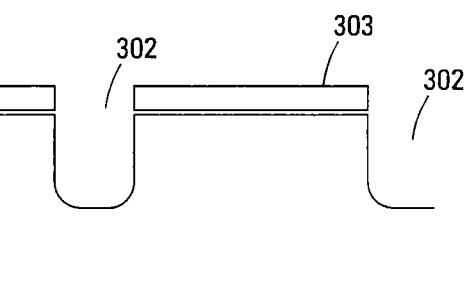
FIG. 3 is a cross section view of an in-process transistor according to one embodiment of the present invention.

FIG. 3 is a cross section of a semiconductor substrate that has been patterned and etched in an array pattern as shown in the plan view of FIG. 4. Starting with a semiconductor substrate, rectangles 402 are etched in the substrate for field isolation, by patterning deposited nitride 303 on the substrate, and etching into the silicon a plurality of openings 302 in the desired pattern. The openings are filled with a dielectric 502, seen in cross section in FIG. 5, in one embodiment in a high-density plasma (HDP) deposition process. Chemical-mechanical planarization (CMP) follows to create a uniform top surface.

Figure 5:
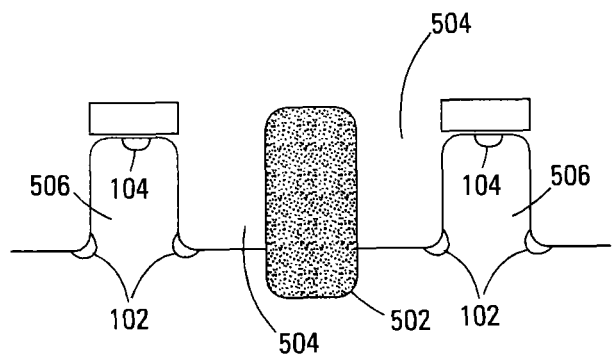
FIG. 5 is a cross section view of an in-process transistor according to one embodiment of the present invention.

The nitride layer 303 is masked and etched to form memory core trenches 504 between the shallow trench isolation regions 502 as shown in cross section in FIG. 5. As a result, pillars or islands 506 of substrate material are created. Source region implants are performed to create diffused source regions 102 near the base of the islands 506.

Figure 6:
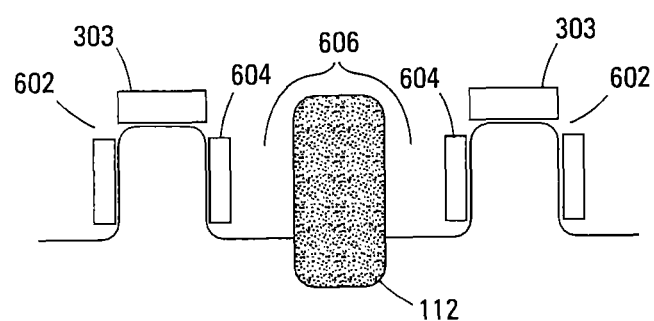
FIG. 6 is a cross section view of an in-process transistor according to one embodiment of the present invention.

Referring to FIG. 6, a tunnel oxide 602 is deposited in the memory core trenches to create isolation to isolate floating gate structures to be deposited of the tunnel oxide from the silicon. Following the deposition of the tunnel oxide, a floating gate polysilicon layer (poly 1) is deposited, isolated from the silicon by the tunnel oxide. Another CMP process is performed to the nitride layer 303 to create a uniform top surface once again. An etch resistive material such as photoresist is deposited and patterned, and the exposed polysilicon is etched to leave the floating gate structures 604 for two transistors shown in the cross section in FIG. 6. The etch leaves openings 606 between the floating gate structures and the isolation regions 112.

Figure 7:
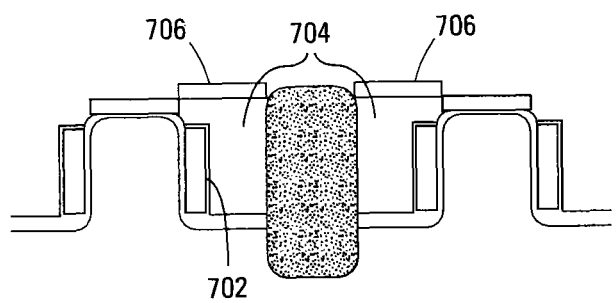
FIG. 7 is a cross section view of an in-process transistor according to one embodiment of the present invention.

Referring to FIG. 7, an oxide layer such as an oxide-nitride-oxide (ONO) layer 702 is then deposited in the openings 606 to insulate the floating gate structures 604. If source regions have not been formed in an earlier process, they are implanted before the ONO layer is deposited. A second polysilicon layer (poly 2) is deposited to form the control gate structures 704, and another CMP process is performed down to the nitride layer. The control gate structures 704 extend along multiple transistor pillars, and control multiple transistors in alternating columns. A self-aligned silicide layer 706 is deposited on the top of the control gate structures 704 in the X direction of the array to form word lines such as those shown in greater detail in FIG. 2. Once the word lines are in place, a nitride strip operation removes the nitride layer 303, leaving drain contact areas 204 as shown in greater detail in FIG. 2. An ion implantation is effected to create drain regions near the tops of the pillars. Each drain region serves as the drain for two different source regions accessible by the same bit line but different word lines.

Normal back end of line processing is used to form drain contacts such as those shown in FIG. 1. In one embodiment, a dielectric layer 115 is formed over the drain contact areas. This dielectric layer may comprise boro-phospho-silicate glass (BPSG) or phospho-silicate glass (PSG). Alternatively, other low dielectric constant materials may be used. Contact openings are etched through the dielectric layer to the drain contact areas, and contacts are formed in the openings. Once the contacts are formed, a metal layer is formed to join the drain contacts.

Figure 8:
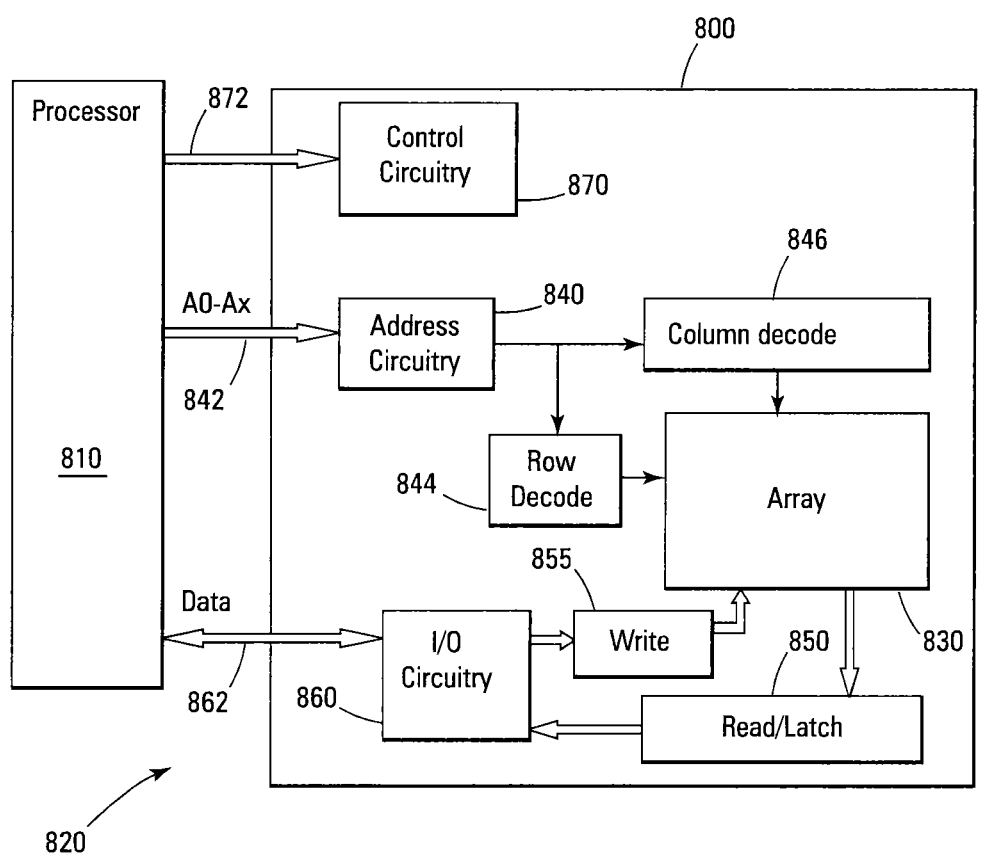
FIG. 8 is a block diagram of a memory device according to another embodiment of the present invention.

FIG. 8 is a functional block diagram of a memory device 800, of one embodiment of the present invention, which is coupled to a processor 810. The memory device 800 and the processor 810 may form part of an electronic system 820. The memory device 800 has been simplified to focus on features of the memory that are helpful in understanding the present invention. The memory device includes an array of memory cells 830. The memory cells are non-volatile floating-gate memory cells with vertical floating gates as described above. The memory array 830 is arranged in banks of rows and columns.

An address buffer circuit 840 is provided to latch address signals provided on address input connections A0-Ax 842. Address signals are received and decoded by row decoder 844 and a column decoder 846 to access the memory array 830. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 830 by sensing voltage or current changes in the memory array columns using sense/latch circuitry 850. The sense/latch circuitry, in one embodiment, is coupled to read and latch a row of data from the memory array. Data input and output buffer circuitry 860 is included for bi-directional data communication over a plurality of data (DQ) connections 862 with the processor 810.

Command control circuit 870 decodes signals provided on control connections 872 from the processor 810. These signals are used to control the operations on the memory array 830, including data read, data write, and erase operations. The flash memory device has been simplified to facilitate a basic understanding of the features of the memory. A more detailed understanding of internal circuitry and functions of flash memories are known to those skilled in the art.

The various embodiments of the present invention provide a three dimensional transistor and memory cell structure with isolation between adjacent memory cells and in a staggered pattern to allow closer packing of memory cells. Further, the control gates of the present embodiments are self aligned because they are formed in the memory core trenches.

The various embodiments of the present invention are amenable to use with periphery gates on or near the edges of memory arrays, especially those memory arrays using U shaped periphery transistors.

CONCLUSION

A floating gate memory cell has been described that includes isolation regions between adjacent cells, and a staggered pattern of columns of cells, to allow closer packing of cells into a memory array or the like. Two cells are placed on one pillar of material in one embodiment.

The transistor allows the die real estate occupied by the transistor to be reduced while maintaining the coupling area between the floating and control gates. The transistor can be used in non-volatile memory devices, such as flash memory.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. It is manifestly intended that the embodiments be limited only by the following claims and equivalents thereof.

What is claimed is:

1. An array of memory cells, comprising:
    first and second successively adjacent rows of memory cells on a first row of pillars, each pillar of the first row of pillars having a memory cell of the first row of memory cells and a memory cell of the second row of memory cells on opposite sides thereof;
    third and fourth successively adjacent rows of memory cells on a second row of pillars, the second row of pillars being successively adjacent the first row of pillars, each pillar of the second row of pillars having a memory cell of the third row of memory cells and a memory cell of the fourth row of memory cells on opposite sides thereof, wherein the second and third rows of memory cells are successively adjacent to each other;
    a control gate, wherein all of the memory cells of the second row of memory cells are coupled to one side of the control gate and all of the memory cells of the third row of memory cells are coupled to an opposite side of the control gate; and
    alternating first and second bit lines, wherein each of the memory cells of the second row of memory cells is coupled to a respective one of the first bit lines and each of the memory cells of the third row of memory cells is coupled to a respective one of the second bit lines, and wherein at least one of the second bit lines is between a pair of the first bit lines and is successively adjacent to the first bit lines of the pair of first bit lines.

2. The array of memory cells of claim 1, wherein the pillars comprise silicon.

3. The array of memory cells of claim 1, wherein the memory cells comprise floating gate memory cells.

4. The array of memory cells of claim 3, further comprising an oxide-nitride-oxide layer between the control gate and floating gates of the memory cells of the second row of memory cells.

5. The array of memory cells of claim 1, wherein each of the pillars include a drain region formed near a top of the pillar and source regions near a bottom of the pillar.

6. The array of memory cells of claim 1, further comprising isolation regions isolating successively adjacent memory cells of the first row.

7. The array of memory cells of claim 1, wherein the memory cells of the second row of memory cells are staggered from the memory cells of the third row of memory cells.

8. The array of memory cells of claim 1, wherein the memory cells of a respective one of the pillars share a common one of the bit lines.

9. The array of memory cells of claim 1, wherein a word line overlies and is in contact with the control gate.

10. The array of memory cells of claim 1, wherein the control gate comprises a first control gate, and further comprising a second control gate that is not contiguous with the first control gate, wherein all of the memory cells of the first row of memory cells are coupled to the second control gate.

11. The array of memory cells of claim 1, further comprising a dielectric layer formed over the first, second, third, and fourth rows of memory cells.

12. An array of memory cells, comprising:
  a control gate, wherein every memory cell coupled to a first side of the control gate is within a first row of memory cells and every memory cell coupled to a second side of the control gate is within a second row of memory cells, and wherein the first row of memory cells is successively adjacent to the second row of memory cells; and
  alternating first and second bit lines, wherein each of the memory cells of the first row of memory cells is coupled to a respective one of the first bit lines, wherein each of the memory cells of the second row of memory cells is coupled to a respective one of the second bit lines, and wherein the first bit lines are different from the second bit lines;
  wherein the memory cells of the first row of memory cells are respectively formed on sides of pillars of a first row of pillars and the memory cells of the second row of memory cells are respectively formed on sides of pillars of a second row of pillars.

13. The array of memory cells of claim 12, wherein the pillars of the first row of pillars are staggered from the pillars of the second row of pillars.

14. The array of memory cells of claim 13, wherein the first bit lines are respectively coupled to the pillars of the first row of pillars and second bit lines are respectively coupled to the pillars of the second row of pillars.

15. The array of memory cells of claim 12,
  wherein the memory cells of the first row of memory cells are first memory cells and are respectively formed on first sides of the pillars of the first row of pillars;
  wherein the memory cells of the second row of memory cells are second memory cells and are respectively formed on first sides of the pillars of the second row of pillars;
  wherein each of the pillars of the first row of pillars comprises a third memory cell formed on a second side of that pillar that is opposite the first side of that pillar on which a first memory cell is formed; and
  wherein each of the pillars of the second row of pillars comprises a fourth memory cell formed on a second side of that pillar that is opposite the first side of that pillar on which a second memory cell is formed.

16. The array of memory cells of claim 15,
  wherein the first bit lines are respectively coupled to first drains in the pillars of the first row of pillars;
  wherein each first drain is shared by the first and third memory cells respectively formed on the first and second sides of a respective pillar of the first row of pillars;
  wherein the second bit lines are respectively coupled to second drains in the pillars of the second row of pillars; and
  wherein each second drain is shared by the second and fourth memory cells respectively formed on the first and second sides of a respective pillar of the second row of pillars.

17. The array of memory cells of claim 16,
  wherein each pillar of the first row of pillars comprises first and second source regions respectively coupled to the first and third memory cells respectively formed on the first and second sides of that pillar of the first row of pillars; and
  wherein each pillar of the second row of pillars comprises first and second source regions respectively coupled to the second and fourth memory cells respectively formed on the first and second sides of that pillar of the second row of pillars.

18. The array of memory cells of claim 15, wherein the third memory cell formed on a second side of a respective pillar of the first row of pillars is electrically isolated from the first memory cell formed on the first side of the respective pillar of the first row of pillars, and wherein the fourth memory cell formed on a second side of a respective pillar of the second row of pillars is electrically isolated from the first memory cell formed on the first side of the respective pillar of the second row of pillars.

19. The array of memory cells of claim 12, wherein a word line overlies and is in contact with the control gate so that every memory cell that is coupled to the first side of the control gate and that is within the first row of memory cells is coupled to a first side of the word line, and every memory cell that is coupled to the second side of the control gate and that is within the second row of memory cells is coupled to a second side of the word line that is opposite the first side of the word line.

20. A memory array, comprising:
  at least three pillars;
  a memory cell on each of the at least three pillars;
  a word line commonly coupled to the memory cells on the at least three pillars;
  a first bit line coupled to the memory cell on a first pillar of the at least three pillars;
  a second bit line coupled to the memory cell on a second pillar of the at least three pillars; and
  a third bit line coupled to the memory cell on a third pillar of the at least three pillars;
  wherein the memory cells on the first and second pillars of the at least three pillars are coupled to a same side of the word line and the memory cell on the third pillar of the at least three pillars is coupled to an opposite side of the word line; and
  wherein the third bit line is between the first and second bit lines, the third bit line is successively adjacent to the first bit line, and the second bit line is successively adjacent to the third bit line.

21. The memory array of claim 20, wherein the memory cell on each of the at least three pillars is first memory cell on each of the at least three pillars, and further comprising a second memory cell on each of the at least three pillars, wherein the first and second memory cells on each of the at least three pillars are electrically isolated from each other.

* * * * *